US011165433B2

(12) United States Patent
 Ichikawa et al.

(10) Patent No.: US 11,165,433 B2
(45) Date of Patent: Nov. 2, 2021

(54) CHARGE PUMP, PLL CIRCUIT, AND OSCILLATOR

(71) Applicant: Seiko Epson Corporation, Tokyo (JP)

(72) Inventors: Ryo Ichikawa, Minowa (JP); Hisahiro Ito, Minowa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/117,319

(22) Filed: Dec. 10, 2020

(65) Prior Publication Data
US 2021/0184685 A1   Jun. 17, 2021

(30) Foreign Application Priority Data

Dec. 11, 2019 (JP) .............................. JP2019-223508

(51) Int. Cl.
*H03L 7/089* (2006.01)
*H03L 7/099* (2006.01)
*H03L 7/197* (2006.01)
*H03L 7/093* (2006.01)

(52) U.S. Cl.
CPC ............ *H03L 7/0893* (2013.01); *H03L 7/093* (2013.01); *H03L 7/099* (2013.01); *H03L 7/1974* (2013.01)

(58) Field of Classification Search
CPC ....... H03L 7/085; H03L 7/089; H03L 7/0891; H03L 7/0893; H03L 7/0895; H03L 7/0896; H03L 7/0898; H03L 7/093; H03L 7/099; H03L 7/0991; H03L 7/1974
See application file for complete search history.

(56) References Cited

U.S. PATENT DOCUMENTS

| | | | | |
|---|---|---|---|---|
| 5,412,309 A * | 5/1995 | Ueunten | ................. | G05F 3/267 |
| | | | | 323/303 |
| 7,728,529 B2 * | 6/2010 | Liu | ........................ | H05B 45/46 |
| | | | | 315/291 |
| 9,419,632 B1 * | 8/2016 | Lee | ........................ | H03L 7/0896 |
| 10,778,111 B1 * | 9/2020 | Godycki | ............... | H02M 5/293 |
| 2012/0133404 A1 * | 5/2012 | Hsueh | ..................... | H03L 7/089 |
| | | | | 327/157 |

FOREIGN PATENT DOCUMENTS

JP   2007-116488 A   5/2007
JP   2016-046543 A   4/2016

* cited by examiner

*Primary Examiner* — Diana J. Cheng
(74) *Attorney, Agent, or Firm* — Harness, Dickey & Pierce, P.L.C.

(57) ABSTRACT

A charge pump includes: a switch circuit that switches a current source conducted to an output node based on a signal from a phase frequency detector included in a PLL circuit; a first current source that is the current source provided between a high potential node and the switch circuit, and supplies a current to the output node by a first conduction-type depletion mode MOS transistor forming a self-bias circuit; and a second current source that is the current source provided between a low potential node and the switch circuit, and draws the current from the output node by the first conduction-type depletion mode MOS transistor forming the self-bias circuit.

5 Claims, 11 Drawing Sheets

CHARGE PUMP, PLL CIRCUIT, AND OSCILLATOR

The present application is based on, and claims priority from JP Application Serial Number 2019-223508, filed Dec. 11, 2019, the disclosure of which is hereby incorporated by reference herein in its entirety.

BACKGROUND

1. Technical Field

The present disclosure relates to a charge pump, a PLL circuit, and an oscillator.

2. Related Art

In the related art, a charge pump that supplies a current to an output terminal according to an input signal and draws the current from the output terminal has been known. For example, JP-A-2007-116488 discloses a technology in which in a charge pump used for a PLL circuit, a current source for current supplying is constituted by a P-type depletion mode MOS transistor 123a, and a current source for current drawing is constituted by an N-type depletion mode MOS transistor.

In the above-described technology in the related art, a conduction-type MOS transistor in which a current source for current supplying and a current source for current drawing, each of which constitutes the charge pump, are different from each other is described. In order to form an N-type channel or P-type channel in a MOS transistor, a process such as ion injection or ion diffusion is generally performed in a semiconductor manufacturing process. Each of the N-type channel and the P-type channel is formed by injecting different ions, and thus formed in different processes. Therefore, it is extremely difficult to make the N-type channel and the P-type channel have the same characteristics. A current flowing through the charge pump is determined depending on the characteristics of the channel of the MOS transistor included in the current source constituting the charge pump. Therefore, when the characteristics of the channel of the MOS transistor included in the current source constituting the charge pump vary, it is difficult to adjust the current flowing through the charge pump.

SUMMARY

A charge pump includes: a switch circuit that switches a current source conducted to an output node based on a signal from a phase frequency detector included in a PLL circuit; a first current source that is the current source provided between a high potential node and the switch circuit, and supplies a current to the output node by a first conduction-type depletion mode MOS transistor forming a self-bias circuit; and a second current source that is the current source provided between a low potential node and the switch circuit, and draws the current from the output node by the first conduction-type depletion mode MOS transistor forming the self-bias circuit.

DESCRIPTION OF EXEMPLARY EMBODIMENTS

Figure 1:
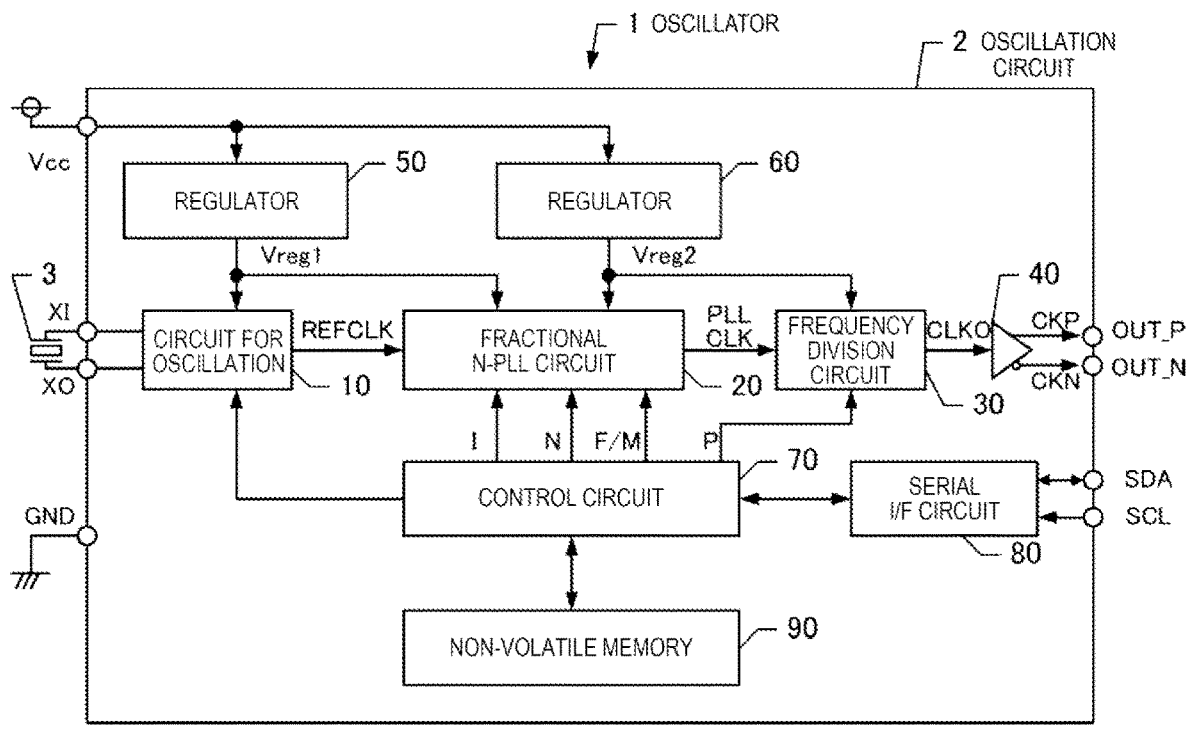
FIG. 1 is a configuration diagram of an oscillator according to an embodiment of the present disclosure.

Embodiments of the present disclosure will be described in the following order.
(1) Configuration of Oscillator:
(1-1) Configuration of Fractional N-PLL Circuit:
(1-2) Configuration of charge pump:
(1-3) Adjustment of Current:
(2) Second Embodiment:
(3) Third Embodiment:
(4) Fourth Embodiment:
(5) Fifth Embodiment:
(6) Other Embodiments:

(1) Configuration of Oscillator:

FIG. 1 is a configuration diagram of an oscillator according to an embodiment of the present disclosure. The oscillator 1 includes an oscillation circuit 2 and a resonator 3, and the oscillation circuit 2 and the resonator 3 are housed in a package (not illustrated). In the present embodiment, the resonator 3 is a quartz crystal resonator using quartz crystal as a substrate material, and for example, an AT cut or SC cut quartz crystal resonator is used. The resonator 3 may be a surface acoustic wave (SAW) resonator or a micro electro mechanical system (MEMS) resonator. As the substrate material of the resonator 3, in addition to the quartz crystal, a piezoelectric material such as piezoelectric single crystal such as lithium tantalate or lithium niobate or piezoelectric ceramics such as lead zirconate titanate, a silicon semiconductor material, or the like can be used. An excitation circuit of the resonator 3 may employ a piezoelectric effect, or may employ electrostatic driving due to a Coulomb force.

The oscillation circuit 2 is provided with a VCC terminal which is a power source terminal, a GND terminal which is a grounding terminal, an OUT_P terminal and an OUT_N terminal which are differential output terminals, an SDA terminal and an SCL terminal for external interfacing, and an XI terminal and an XO terminal which are coupling terminals with the resonator 3. The Vcc terminal, the GND terminal, the OUT_P terminal, the OUT_N terminal, the SDA terminal, and the SCL terminal are also coupled to an external terminal (not illustrated) of the oscillator 1.

In the present embodiment, the oscillation circuit 2 includes a circuit for oscillation 10, a fractional N-PLL circuit 20, a frequency division circuit 30, an output circuit 40, a regulator 50, a regulator 60, a control circuit 70, a serial interface (I/F) circuit 80, and a non-volatile memory 90. Note that the oscillation circuit 2 of the present embodiment may have a configuration in which some of these elements are omitted or changed, or a configuration in which other elements are added thereto. The oscillation circuit 2 may be configured by one semiconductor integrated circuit (IC), or may be configured by a plurality of ICs. The oscillation circuit 2 may be partially configured by a discrete component.

The circuit for oscillation 10 is a circuit for oscillating the resonator 3, and amplifies an output signal of the resonator 3 to feed the amplified output signal back to the resonator 3. The circuit for oscillation 10 outputs a clock signal (oscillation signal) REFCLK based on the oscillation of the resonator 3. For example, the oscillation circuit configured by the resonator 3 and the circuit for oscillation 10 may be various types of oscillation circuits such as a pierce oscillation circuit, an inverter type oscillation circuit, a Colpitts oscillation circuit, or a Hartley oscillation circuit.

The fractional N-PLL circuit 20 generates a clock signal PLLCLK obtained by multiplying a frequency (reference frequency) of the clock signal REFCLK by an integer or (integer+fraction) according to a frequency division ratio input from the control circuit 70. Here, when an integer part of the frequency division ratio (integer frequency division ratio) is defined as N and a fraction part (fractional frequency division ratio) is defined as F/M, a relationship of the following Equation (1) is established between a frequency $f_{REFCLK}$ of the clock signal REFCLK and a frequency $f_{PLLCLK}$ of the clock signal PLLCLK.

$$f_{PLLCLK} = \left(N + \frac{F}{M}\right) \times f_{REFCLK} \quad (1)$$

The frequency division circuit 30 divides the clock signal PLLCLK output from the fractional N-PLL circuit 20 by an output frequency division ratio P (P is an integer of 1 or more) input from the control circuit 70 to generate a clock signal CLKO. Here, a relationship of the following Equation (2) is established between a frequency $f_{PLLCLK}$ of the clock signal PLLCLK and a frequency $f_{CLKO}$ of the clock signal CLKO.

$$f_{CLKO} = \frac{f_{PLLCLK}}{P} \quad (2)$$

Therefore, based on Equations (1) and (2), the relationship of the following Equation (3) is established between the frequency $f_{REFCLK}$ of the clock signal REFCLK and the frequency $f_{CLKO}$ of the clock signal CLKO.

$$f_{CLKO} = \left(N + \frac{F}{M}\right) \times \frac{f_{REFCLK}}{P} \quad (3)$$

The output circuit 40 converts the clock signal CLKO output from the frequency division circuit 30 into a differential signal formed by a non-inverted signal CKP and an inverted signal CKN. The non-inverted signal CKP is output to the outside from the output terminal OUT_P, and the inverted signal CKN is output to the outside from the output terminal OUT_N. The output circuit 40 may be, for example, a differential output circuit such as a low voltage differential signaling (LVDS) circuit, a positive emitter coupled logic (PECL) circuit, or a low voltage PECL (LVPECL) circuit. However, the output circuit 40 may be a single-ended output circuit.

The regulator 50 generates a constant voltage Vreg1 lower than a power supply voltage Vcc supplied from the Vcc terminal based on the Vcc. The constant voltage Vreg1 is supplied as a power supply voltage of the circuit for oscillation 10 and a power supply voltage of a part of the circuit in the fractional N-PLL circuit 20.

The regulator 60 generates a constant voltage Vreg2 lower than the power supply voltage Vcc supplied from the Vcc terminal based on the Vcc. The constant voltage Vreg2 is supplied as a power supply voltage of a part of the circuit in the fractional N-PLL circuit 20 and a power supply voltage of the frequency division circuit 30.

In the present embodiment, the constant voltage Vreg1 and the constant voltage Vreg2 are the same voltage, but the Vreg1 and the Vreg2 may be different from each other as long as malfunction does not occur in an interface portion between a circuit using the Vreg1 as a power supply voltage and a circuit using the Vreg2 as a power supply voltage.

In the present embodiment, the serial interface circuit 80 is a digital interface circuit based on I²C standard, and a serial data signal is input and output from and to the SDA terminal and the clock signal is input from the SCL terminal. Reading/writing from an external device with respect to a control register (not illustrated) or the non-volatile memory 90 included in the control circuit 70 may be performed through the SDA terminal, SCL terminal, and the serial interface circuit 80. The serial interface circuit 80 may be an interface circuit based on a communication standard other than the I²C standard. Further, the oscillator 1 may not include an external terminal (in FIG. 1, SDA terminal and SCL terminal) dedicated for interface, and may have a configuration in which the OUT_P terminal or OUT_N terminal, or a functional terminal (not illustrated) is used as an external terminal for interface by switching a mode due to an external operation.

The control circuit 70 includes a control register (not illustrated), and controls each operation of the circuit for oscillation 10, the fractional N-PLL circuit 20, and the frequency division circuit 30 according to the setting value of the control register. The control register can perform setting of a magnitude of a current in a current source of the charge pump 22, setting of a frequency adjustment value or the like of the circuit for oscillation 10, setting of the integer frequency division ratio N or fractional frequency division ratio F/M of the fractional N-PLL circuit 20, setting the output frequency division ratio P of the frequency division circuit 30, and the like. In the present embodiment, the external device sets the magnitude I of current, the integer frequency division ratio N, the fractional frequency division ratio F/M, and the output frequency division ratio P through the serial interface circuit 80, and supplies the signals to the fractional N-PLL circuit 20. Then, the frequency division circuit 30 divides the frequency of the clock signal PLLCLK according to the output frequency division ratio P, and the OUT_P terminal and the OUT_N terminal output the clock signal of the frequency determined by Equation (3).

The non-volatile memory 90 is implemented by an electrically erasable programmable read-only memory (EEPROM) or the like, and stores data or the like necessary for starting (supplying power of) the oscillator 1. For example, the non-volatile memory 90 may store control data such as a frequency adjustment value of an oscillation control circuit, initial values of each of the magnitude I of current in the current source of the charge pump 22, the integer frequency division ratio N, the fractional frequency division ratio F/M, and the output frequency division ratio P, and the like. When the oscillator 1 is started (supplied with power), the control circuit 70 reads data stored in the non-volatile memory 90 to set the data in the control register, and performs various controls.

Figure 2:
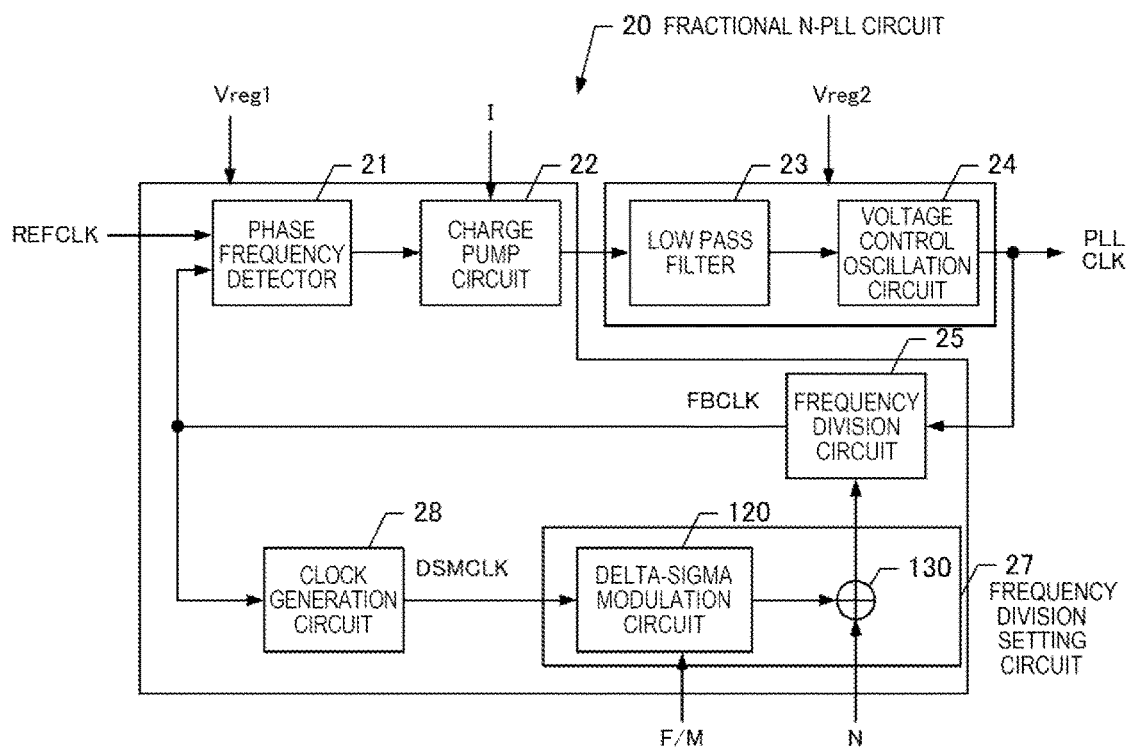
FIG. 2 is a diagram illustrating a configuration example of a fractional N-PLL circuit according to the embodiment of the present disclosure.

(1-1) Configuration of Fractional N-PLL Circuit:

FIG. 2 is a diagram illustrating a configuration example of the fractional N-PLL circuit 20 according to a first embodiment. As illustrated in FIG. 2, the fractional N-PLL circuit 20 includes a phase frequency detector (PFD) 21, a charge pump (CP) 22, a low pass filter (LPF) 23, a voltage control oscillation circuit (VCO) 24, a frequency division circuit 25, a frequency division setting circuit 27, and a clock generation circuit 28.

The phase frequency detector 21 compares a phase difference between the clock signal REFCLK output from the circuit for oscillation 10 and a clock signal FBCLK output from the frequency division circuit 25, and outputs the comparison result as a pulse voltage.

The charge pump 22 converts the pulse voltage output from the phase frequency detector 21 into a current. The low pass filter 23 smooths the current output by the charge pump 22 and converts the current into a voltage. The voltage control oscillation circuit 24 outputs the clock signal PLLCLK whose frequency changes according to the control voltage with the output voltage of the low pass filter 23 as the control voltage. The voltage control oscillation circuit 24 may set a plurality of output frequency ranges with respect to a control voltage range.

The frequency division circuit 25 is provided on a signal path from the output of the voltage control oscillation circuit 24 to the input of the voltage control oscillation circuit 24, and the clock signal FBCLK obtained by dividing, using an output signal of the frequency division setting circuit 27 as a frequency division ratio, the frequency of the clock signal PLLCLK output from the voltage control oscillation circuit 24 is output. A time average value of the output signal of the frequency division setting circuit 27 matches the sum (N+F/M) of the integer frequency division ratio N and the fractional frequency division ratio F/M input from the control circuit 70. Then, in a steady state where the phase of the clock signal REFCLK and the phase of the clock signal FBCLK are synchronized, the frequency of the clock signal PLLCLK which is calculated by Equation (1) matches the frequency of the clock signal REFCLK, and as a result, the clock signal CLKO becomes a desired frequency (target frequency) expressed by Equation (3).

The frequency division setting circuit 27 performs delta-sigma modulation using the fractional frequency division ratio F/M, and sets a frequency division ratio of the frequency division circuit 25. In the present embodiment, the frequency division setting circuit 27 includes a delta-sigma modulation circuit 120 and an addition/subtraction circuit 130. The delta-sigma modulation circuit 120 performs delta-sigma modulation for integrating and quantizing the fractional frequency division ratio F/M in synchronization with a clock signal DSMCLK output from the clock generation circuit 28. The addition/subtraction circuit 130 adds or subtracts a delta-sigma modulation signal output from the delta-sigma modulation circuit 120 and the integer frequency division ratio N. The output signal of the addition/subtraction circuit 130 is input to the frequency division circuit 25 as the output signal of the frequency division setting circuit 27. In the output signal of the frequency division setting circuit 27, a plurality of integer frequency division ratios in a range near the integer frequency division ratio N are changed in time series, and a time average value thereof matches N+F/M.

For example, when the frequency of the clock signal REFCLK is 100 MHz and the target frequency of the clock signal PLLCLK is 3,425 MHz, it is necessary that the time average value of the output signal of the frequency division setting circuit 27, that is, a time average value of the frequency division ratio of the frequency division circuit 25 is 34.25. Thus, the integer frequency division ratio N needs to set to 34, and the fractional frequency division ratio F/M needs to be set to 0.25.

Since 34.25 is a non-integer, the frequency division ratio of 34.25 is approximately achieved by changing the frequency division ratio (integer value) of the frequency division circuit 25 in time series due to the delta-sigma modulation of the delta-sigma modulation circuit 120. For example, when by dividing a certain predetermined period into a plurality of periods, the frequency division ratio of the frequency division circuit 25 is set to 34 in 3/4 of the plurality of divided periods, and the frequency division ratio of the frequency division circuit 25 is set to 35 in the remaining 1/4 periods, the frequency division ratio of 34.25 can be approximately achieved in consideration of the number of pulses of the clock signal FBCLK in the predetermined period.

Figure 3:
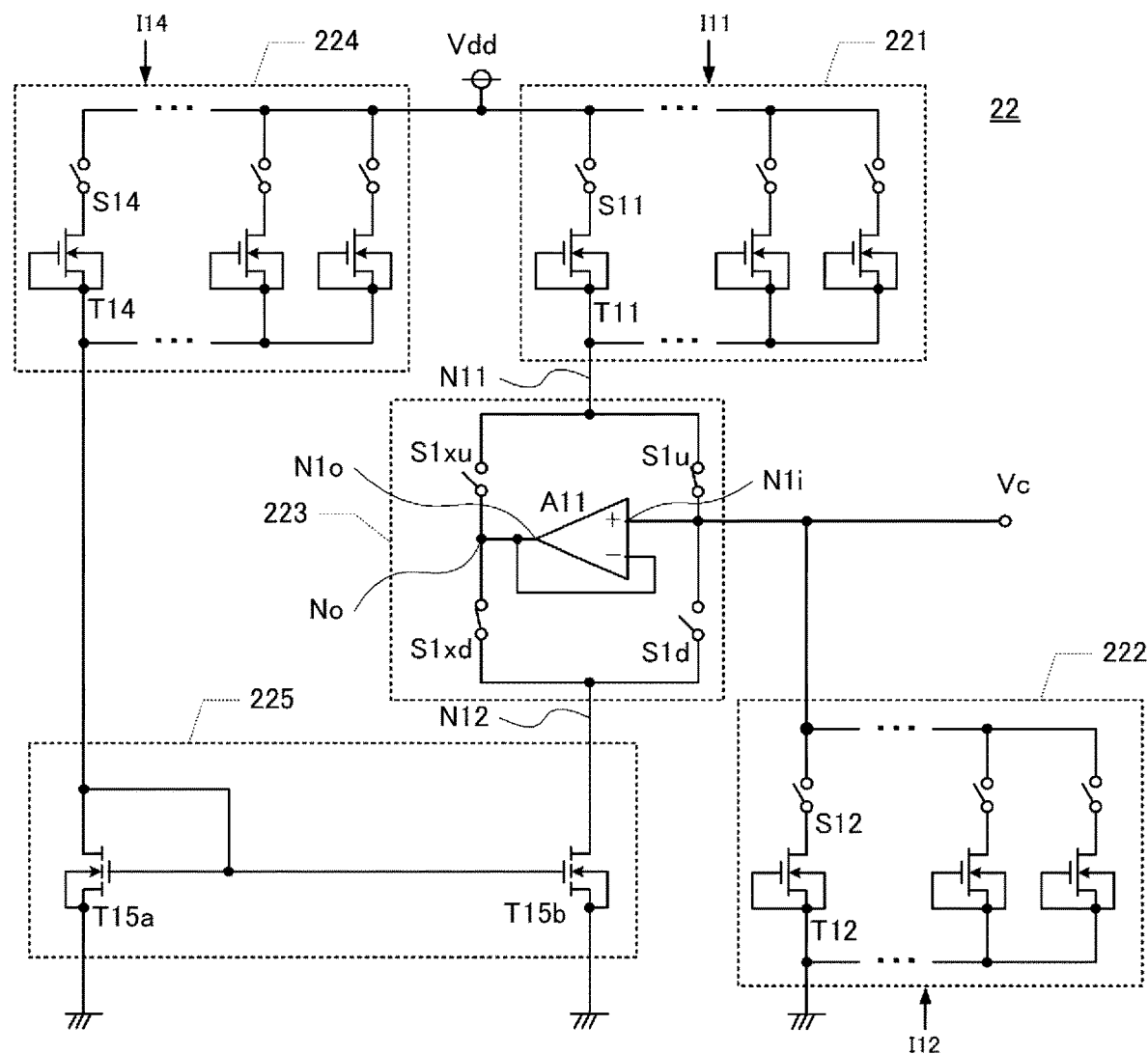
FIG. 3 is a diagram illustrating a charge pump.

(1-2) Configuration of Charge Pump:

As described above, the oscillator 1 according to the present embodiment includes the charge pump 22. The charge pump 22 converts the pulse voltage output from the phase frequency detector 21 into a current, and the converted current is smoothed by the low pass filter 23 and converted into a voltage. FIG. 3 is a diagram illustrating the charge pump 22 according to the present embodiment. The charge pump 22 illustrated in FIG. 3 includes a first current source 221, a second current source 222, a switch circuit 223, a mirror current source 224, and a current mirror current source 225.

In the present embodiment, the charge pump 22 includes a power supply node Vdd which is a high potential node, and a ground which is a low potential node. The charge pump 22 includes the first current source 221 provided between the power supply node Vdd and a current supply node N11. Further, the switch circuit 223 is provided between the current supply node N11 and an output node Vc, and the second current source 222 (bleeder current source) is provided between the output node Vc and the ground.

The first current source 221 includes transistors T11, which are a plurality of N-type depletion mode MOS transistors, coupled in parallel (when the elements coupled in parallel are not especially distinguished, one of the elements in the figures is denoted by one reference signs. The same applies hereinafter). Furthermore, in the first current source 221, a current source switch circuit S11 is provided with the transistor T11 in series between the transistor T11 and the power supply node Vdd. In each of the transistors T11, a gate and a source are coupled with each other to form a self-bias circuit. Further, a drain of the transistor T11 is coupled to one end of the current source switch circuit S11, and the source is coupled to the current supply node N11. Accordingly, when the current source switch circuit S11 is turned on, a constant current determined by characteristics of the corresponding transistor T11 flows through the transistor T11, and the sum of the currents flowing through the transistors T11 coupled in parallel is supplied to the current supply node N11.

The second current source 222 includes transistors T12, which are a plurality of N-type depletion mode MOS transistors, coupled in parallel. Furthermore, in the second current source 222, a current source switch circuit S12 is provided with the transistor T12 in series between the transistor T12 and the output node Vc. In each of the transistors T12, agate and a source are coupled with each other to form a self-bias circuit. Further, a drain of the transistor T12 is coupled to one end of the current source switch circuit S12, and the source is coupled to the ground. Accordingly, when the current source switch circuit S12 is turned on, a constant current determined by characteristics of the corresponding transistor T12 flows through the transistor T12, and the sum of the currents flowing through the transistors T12 coupled in parallel is drawn from the output node Vc.

The mirror current source 224 includes transistors T14, which are a plurality of N-type depletion mode MOS transistors, coupled in parallel. Furthermore, in the mirror current source 224, a current source switch circuit S14 is provided with the transistor T14 in series between the transistor T14 and the power supply node Vdd. In each of the transistors T14, agate and a source are coupled with each other to form a self-bias circuit. Further, a drain of the transistor T14 is coupled to one end of the current source switch circuit S14, and the source is coupled to the current mirror current source 225. Accordingly, when the current source switch circuit S14 is turned on, a constant current determined by characteristics of the corresponding transistor T14 flows through the transistor T14, and the sum of the currents flowing through the transistors T14 coupled in parallel is supplied to the current mirror current source 225.

The current mirror current source 225 includes transistors T15a and T15b which are an N-type enhancement mode MOS transistors. The transistor T15a is provided between the mirror current source 224 and the ground, and the output of the mirror current source 224 is coupled to the drain and the ground is coupled to the source. The transistor T15b is provided between a current drawing node N12 and the ground, the current drawing node N12 is coupled to the drain, and the ground is coupled to the source.

Furthermore, in the transistor T15a, the drain and the gate are coupled with each other, and the gates of the transistors T15a and T15b are coupled with each other. Accordingly, the transistors T15a and T15b form a current mirror circuit. Therefore, the same current as the current output from the mirror current source 224 is mirrored and flows through the transistor T15b.

The switch circuit 223 includes switch circuits S1u, S1xu, S1d, and S1xd, and a voltage follower circuit A11 constituted by an operational amplifier. One terminal of the switch circuits S1u and S1xu is coupled to the current supply node N11. The other terminal of the switch circuit S1u is coupled to the output node Vc. An input terminal N1i of the voltage follower circuit A11 is coupled to the output node Vc. The other terminal of the switch circuit S1xu is coupled to a node No, and the node No is coupled to the output terminal N1o of the voltage follower circuit A11.

One terminal of the switch circuit S1d and the switch circuit S1xd is coupled to the current drawing node N12. The current drawing node N12 is a node from which the current is drawn by the current mirror current source 225 (details will be described later). The other terminal of the switch circuit S1d is coupled to the output node Vc and the input terminal N1i of the voltage follower circuit A11, and the other terminal of the switch circuit S1xd is coupled to the node No and the output terminal N1o of the voltage follower circuit A11.

Figure 4:
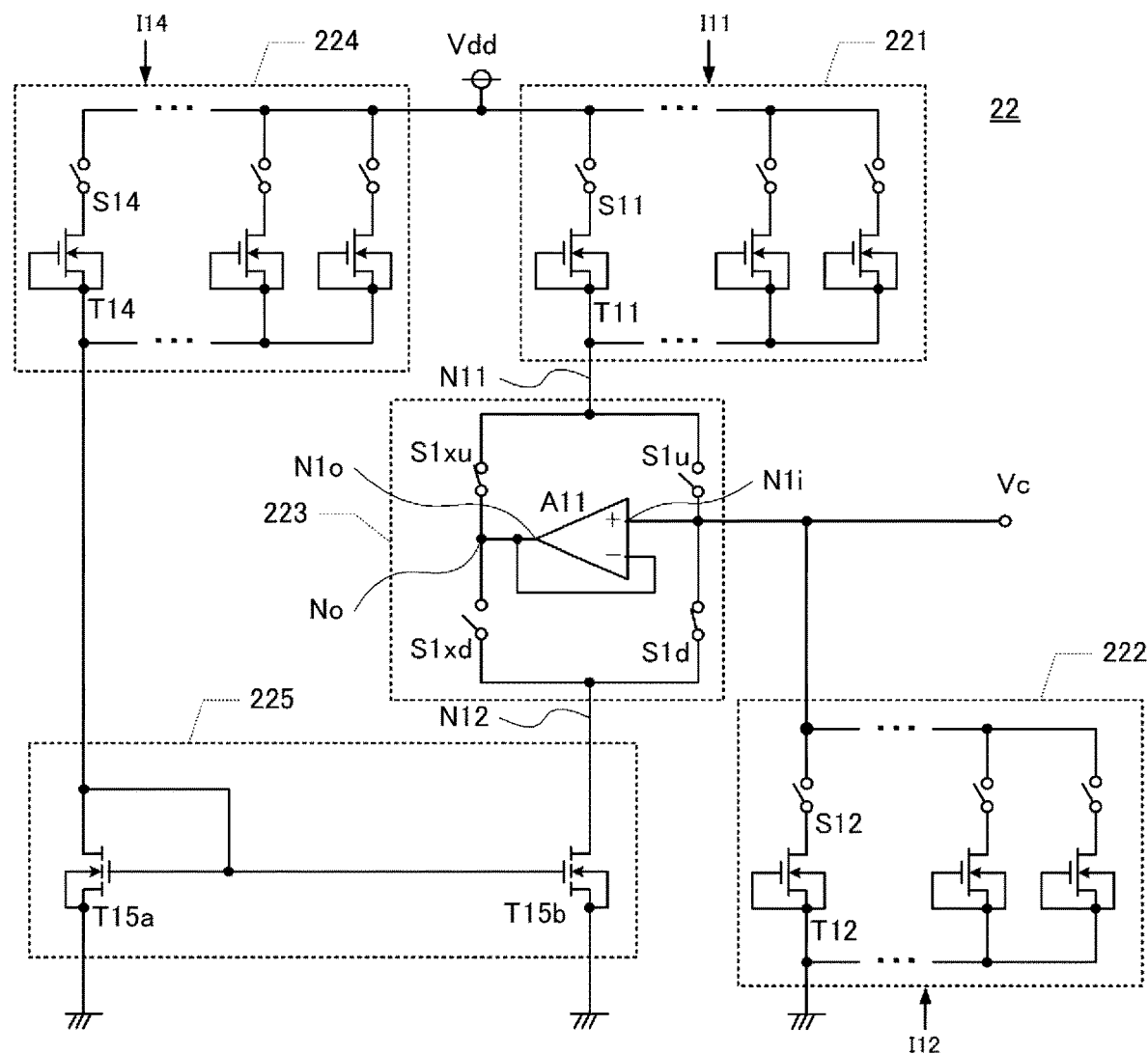
FIG. 4 is a diagram illustrating the charge pump.

In the present embodiment, the switch circuit S1u and the switch circuit S1xu operate so that the on/off states become reverse to each other, and the switch circuit S1d and the switch circuit S1xd operate so that the on/off states become reverse to each other. In FIG. 3, the current supply node N11 and the output node Vc are coupled to the input terminal N1i of the voltage follower circuit A11, and the current drawing node N12 of the current mirror current source 225 is coupled to the output terminal N1o of the voltage follower circuit A11. In FIG. 4, the current supply node N11 is coupled to the output terminal N1o of the voltage follower circuit A11, and the output node Vc and the current drawing node N12 are coupled to the input terminal N1i of the voltage follower circuit A11.

In the present embodiment, the switch circuits Stu, S1xu, S1d, and S1xd are turned on/off according to the output of the phase frequency detector 21. When the phase of the clock signal REFCLK as an input signal to the phase frequency detector 21 is advanced ahead of the phase of the clock signal FBCLK as a feedback signal, the phase frequency detector 21 outputs a UP signal indicating that the phase of the clock signal REFCLK is advanced ahead of the phase of the clock signal FBCLK. Further, when the phase of the clock signal REFCLK as an input signal to the phase frequency detector 21 is delayed behind the phase of the clock signal FBCLK as a feedback signal, the phase frequency detector 21 outputs a DOWN signal indicating that the phase of the clock signal REFCLK is delayed behind the phase of the clock signal FBCLK. When the UP signal is output, it is necessary to advance the phase of the clock signal FBCLK in order to match the phases of the clock signals REFCLK and FBCLK. Thus, in the present embodiment, when the UP signal is input from the phase frequency detector 21 to the charge pump 22, the current is supplied from the first current source 221 to the output node Vc.

Therefore, in the present embodiment, when the UP signal is input from the phase frequency detector 21 to the charge pump 22, the switch circuits S1u, S1xu, S1d, and S1xd are turned on, off, off, and on, respectively, and thus the state illustrated in FIG. 3 is obtained. As a result, the current supplied from the first current source 221 to the current supply node N11 reaches the output node Vc. In this state, a part of the current is drawn by the second current source 222, but the remaining current is supplied from the output node Vc to the low pass filter 23. As a result, the phase of the clock signal PLLCLK output from the voltage control oscillation circuit 24 is advanced based on the output voltage of the low pass filter 23, and the phase of the clock signal FBCLK is also advanced.

When the DOWN signal is output, it is necessary to delay the phase of the clock signal FBCLK in order to match the phases of the clock signals REFCLK and FBCLK. Thus, in the present embodiment, when the DOWN signal is input from the phase frequency detector 21 to the charge pump 22, the current is drawn from the output node Vc by the second current source 222 and the current mirror current source 225. In the present embodiment, when the DOWN signal is input from the phase frequency detector 21 to the charge pump 22, the switch circuits S1u, S1xu, S1d, and S1xd are turned off, on, on, and off, respectively, and thus the state illustrated in FIG. 4 is obtained. As a result, no current is supplied from the first current source 221 to the output node Vc. On the other hand, since the second current source 222 and the current mirror current source 225 are coupled to the output node Vc, the current is drawn from the output node Vc by these current sources. As a result, the phase of the clock signal PLLCLK output from the voltage control oscillation circuit 24 is delayed based on the output voltage of the low pass filter 23, and the phase of the clock signal FBCLK is also delayed.

As described above, in the present embodiment, it is switched whether or not the first current source 221 is conducted to the output node Vc based on the signal from the phase frequency detector 21 of the fractional N-PLL circuit 20. On the other hand, in the present embodiment, the second current source 222 is coupled to the output node Vc regardless of switching by the switch circuit 223. Therefore, in the present embodiment, the second current source 222 functions as a bleeder current source that draws the current from the output node Vc without depending on the output from the phase frequency detector 21.

In the present embodiment, the switch circuit 223 is operated in response to both the UP signal and the DOWN signal, but the switch circuit 223 may be operated in response to one of the UP signal and the DOWN signal. When neither the UP signal nor the DOWN signal is output, the current may be stopped to be drawn from the output node Vc. In this case, it is preferable that each of the switch circuits S1u, S1xu, S1d, and S1xd is turned off, on, off, and on, respectively in the switch circuit 223.

The switch circuit 223 according to the present embodiment includes the voltage follower circuit A11 as described above. Therefore, the voltage at the output node Vc of the charge pump 22 can be stabilized and noise can be thus suppressed. Specifically, the voltage follower circuit A11 is operated so as to match the voltages of the output terminal N1o and the input terminal N1i of the voltage follower circuit A11. Thus, fluctuation in the voltage due to change of the switch, or fluctuation in the voltage in error can be suppressed, as compared with a case where the voltage follower circuit A11 is not provided.

For example, it is assumed that the voltage follower circuit A11 is not provided in a state illustrated in FIG. 4. In this case, circuits other than the switch circuits S1xu and S1xd are not coupled to the node No. Circuits other than the switch circuits S1u and S1d are not coupled to the output node Vc. In this case, when the switch circuits Stu and S1xd are turned off and the switch circuits S1xu and S1d are turned on, the current output from the first current source 221 does not flow to the output node Vc. Further, the current supply node N11 is conducted to the node No by the switch circuit S1xu. However, the switch circuit S1xd is turned off, and thus electric charges are easily accumulated without allowing the current output from the first current source 221 to flow from the node No to the other portion. As a result, the voltage of the node No is easily fluctuated from the state before the switching of the switch circuit 223, and approaches the voltage equivalent to the power supply node Vdd, for example.

When switching is performed by the switch circuit 223, the current supply node N11 is discoupled from the node No and is coupled to the output node Vc. However, when the voltage of the node No is fluctuated to approach the voltage equivalent to the power supply node Vdd as described above, the voltage that is significantly different from the voltage of the output node Vc is applied to the output node Vc in a stage of performing switching by the switch circuit 223. As a result, the voltage of the output node Vc may suddenly change. When such a voltage fluctuation occurs, noise is generated from the charge pump 22.

The switch circuit 223 according to the present embodiment includes the voltage follower circuit A11 as illustrated in FIGS. 3 and 4. Accordingly, the voltage of the output terminal N1o of the voltage follower circuit A11 matches the voltage of the input terminal N1i of the voltage follower circuit A11. Therefore, as illustrated in FIG. 4, even when the switch circuits S1u and S1xd are turned off, and the current output from the first current source 221 flows to the node No and does not flow elsewhere, the voltage of the output terminal N1o is kept same as the voltage of the input terminal N1i. Thus, the voltage of the node No is kept the same as the voltage of the output node Vc. Therefore, even when the switching is performed by the switch circuit 223 and the state illustrated in FIG. 3 is obtained, fluctuation in the voltage of the output node Vc is suppressed. When an error has occurred, for example, even when each of the switch circuits S1u, S1xu, S1d, and S1xd is turned on, off, on, and off, respectively, such a noise suppression operation is performed. Further, even when the switch circuits S1u, S1xu, S1d, and S1xd is turned off, on, off, and on, respectively because the current drawing is stopped, the noise suppression operation is performed.

(1-3) Adjustment of Current:

The charge pump 22 according to the present embodiment includes a current source. As described above, the control circuit 70 sets the magnitude I of current in the current source of the charge pump 22 in the control register, such that the magnitude I of the current can be adjusted. Specifically, in the first current source 221 of the present embodiment, a plurality of sets of the current source switch circuit S11 and the transistor T11 are coupled in series, the plurality of sets of the current source switch circuit S11 and the transistor T11 being coupled in parallel, as illustrated in FIG. 3. Accordingly, in the first current source 221, a switch to be turned on among the current source switch circuits S11 are selected, such that the total sum of the currents flowing in the current supply node N11 can be adjusted. In the present embodiment, the second current source 222 and the mirror current source 224 also have the same configuration, and the magnitude of the current can be adjusted.

In FIG. 3, the magnitudes of the currents of the first current source 221, the second current source 222, and the mirror current source 224 are specified as values I11, I12 and I14, respectively. That is, the magnitudes I of the currents described above are specified in detail by three values I11, I12, and I14. The value may be a value specifying the magnitude of each current source, a current value, or a reference sign specifying a switch to be turned on, and various configurations of the value can be adopted. In any case, in each of the first current source 221, the second current source 222, and the mirror current source 224, the switch to be turned on is turned on, and the switch to be turned off is turned off according to the values I11, I12, and I14. As a result, the specified current is output from each current source.

As described above, in order to adjust the current output from the current source forming the charge pump 22 and to make the charge pump 22 operate as expected, it is preferable that the current supplied to the output node Vc and the current drawn from the output node Vc can be adjusted by a value as designed. For example, many charge pumps are designed so that the current supplied from the first current source 221 to the output node Vc and the current drawn from the output node Vc by the second current source 222 match or are correlated with each other. The fact that the currents are correlated means that the current supplied to the output node Vc and the current drawn from the output node Vc have a predetermined relationship.

For example, when the currents match with each other, they are correlated with each other. Further, when the second current source 222 always draws the current from the phase frequency detector 21 without depending on the UP signal as in the example illustrated in FIG. 3, the current supplied from the first current source 221 needs to be greater than the current drawn by the second current source 222. When the current supplied from the first current source 221 is greater than the current drawn by the second current source 222 by a constant value, the two currents are correlated with each other.

In the charge pump 22, the current flowing to the current source is determined by the values I11, I12, and I14, but the current value cannot be changed arbitrarily due to the structure of the current source. That is, in each current source, the magnitude of the current is adjusted by turning on or off the switch coupled to the transistor forming the current source. Therefore, the current changes only discretely in each current source.

Under such restrictions, in order to adjust the current supplied from the first current source 221 and the current drawn by the second current source 222 to an expected value, it is preferable that the currents that change depending on turning on and off the switch coupled to the transistor are correlated with the first current source 221 and the second current source 222. That is, when the currents that change depending on turning on and off the switch are correlated with the first current source 221 and the second current source 222, adjustment of matching the current supplied from the first current source 221 with the current drawn by the second current source 222 or increasing the currents by a constant value after the match, is easily performed.

For example, when the transistors T11 forming the first current source 221 and the transistor T12 forming the second current source 222 have common characteristics, such as the same magnitude of current flowing through the transistors, if the same number of switches are turned on and the same number of transistors are operated in the first current source 221 and the second current source 222, the current supplied from the first current source 221 and the current drawn by the second current source 222 can match with each other. If the current supplied from the first current source 221 and the current drawn by the second current source 222 match with each other, the number of transistors through which the current flows in the first current source 221 is further increased, such that the current value can be determined by increasing it by current x number for one transistor.

However, when the characteristics of the transistor T11 forming the first current source 221 and the transistor T12 forming the second current source 222 vary, it is very difficult to adjust the current. For example, it is assumed that the transistor T11 forming the first current source 221 and the transistor T12 forming the second current source 222 are different conduction-type depletion mode MOS transistors. Further, it is assumed that a plurality of transistors T11 forming the first current source 221 include different conduction-type transistors, or transistors T12 forming the second current source 222 include different conduction-type transistors.

The conduction-type polarity (N-type or P-type) is determined by changing a kind of an element which becomes a channel in ion injection, diffusion, and the like. Therefore, the different conduction-type depletion mode MOS transistors are manufactured in different processes. Further, it is difficult to make the characteristics (magnitudes of currents flowing through the transistors) of different depletion mode MOS transistors manufactured in different processes uniform. Therefore, when one of the first current source 221 and the second current source 222 is formed of a transistor having a different conduction-type from the other, or when the different conduction-type transistors are mixed in the same current source, it is difficult to adjust the current.

On the other hand, if the transistors are manufactured in the same process, the characteristics of the same conduction-type transistor can be made uniform. As in the present embodiment, if the transistor T11 forming the first current source 221 and the transistor T12 forming the second current source 222 are manufactured in the same process and have the same conduction-type, common characteristics can be provided to each transistor. Therefore, it is possible to provide common characteristics to the first current source 221 and the second current source 222. Since the first current source 221 and the second current source 222 in the present embodiment are formed of such transistors, the currents of the first current source 221 and the second current source 222 can be easily adjusted to have the expected relationship (value).

In the present embodiment, the mirror current source 224 also has the same circuit configuration as the first current source 221 and the second current source 222, and the current supplied from the mirror current source 224 can be adjusted by the value I14. Also in the mirror current source 224, it is preferable to manufacture the transistor T14 forming the mirror current source 224 in the same process as the first current source 221 and the second current source 222. With this configuration, common characteristics can be provided to the transistors T11 and T12 forming the first current source 221 and the second current source 222, respectively and the transistor T14 forming the mirror current source 224. As a result, the magnitude of the current drawn by the current mirror current source 225 can be easily adjusted in relation with the first current source 221 and the second current source 222.

That is, the magnitude of the current supplied by the mirror current source 224 is the magnitude of the current mirrored by the current mirror current source 225 and drawn by the transistor T15b. Therefore, if the transistors T11 and T12 and the transistor T14 have common characteristics, the magnitude of the current drawn by the current mirror current source 225 can be adjusted while correlating the first current source 221 with the second current source 222.

Figure 5:
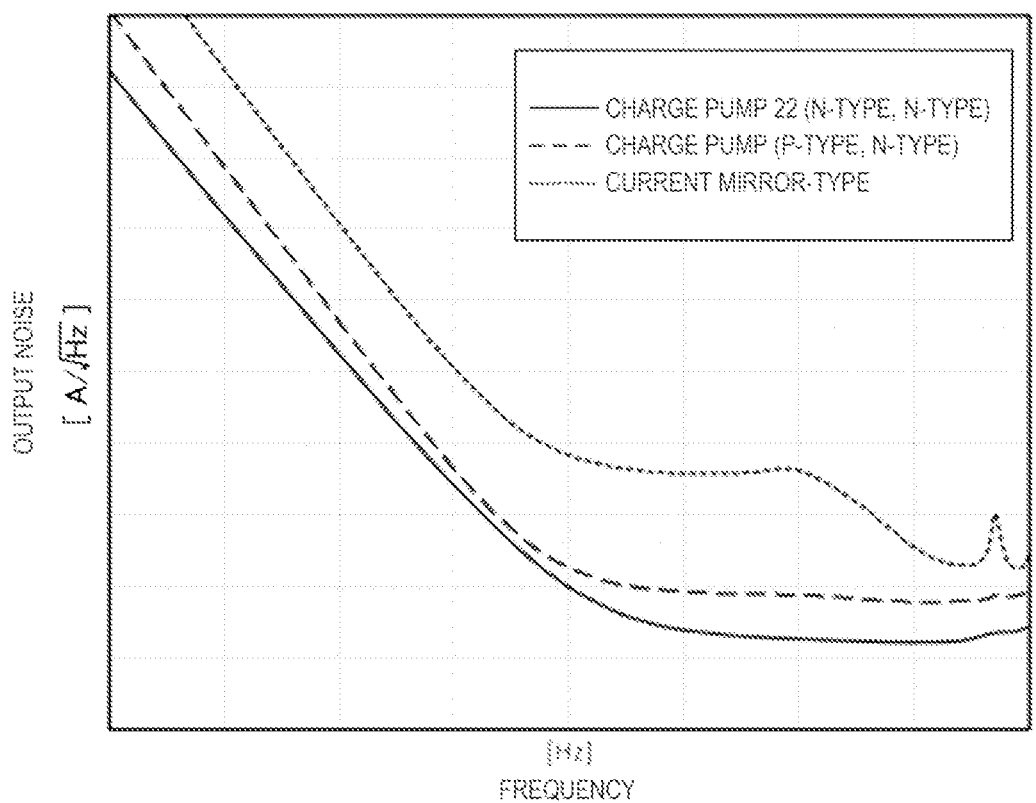
FIG. 5 is a graph illustrating current noise of the charge pump.

Further, according to the present embodiment, current noise can be reduced as compared with the charge pump in the related art. FIG. 5 is a graph illustrating current noise of the charge pump. A horizontal axis represents frequency (Hz) and a range from a direct current to a predetermined frequency in the number of pairs. A vertical axis represents output noise $(A/(Hz)^{1/2})$. In FIG. 5, an absolute amount of current noise appearing in the output of the charge pump is shown in each frequency from the direct current to a predetermined frequency. Further, in FIG. 5, a solid line indicates current noise when N-type depletion mode MOS transistors are used for the charge pump 22 of the present embodiment, that is, the transistors of the first current source 221 and the second current source 222. In addition, a rough broken line indicates current noise in a configuration (comparison configuration) in which the transistor of the first current source 221 in the configuration illustrated in FIG. 3 is replaced with a P-type depletion mode MOS transistor.

The thin broken line shows the current noise when the current mirror-type charge pump (comparison configuration) is used.

As illustrated in FIG. 5, it is known that in the charge pump 22 of the present embodiment, the current noise and a noise level are reduced over all frequencies of the clock signal PLLCLK as compared with the charge pump (circuit using different conduction-type transistors, current mirror-type circuit) in the related art which is the comparison configuration.

Figure 6:
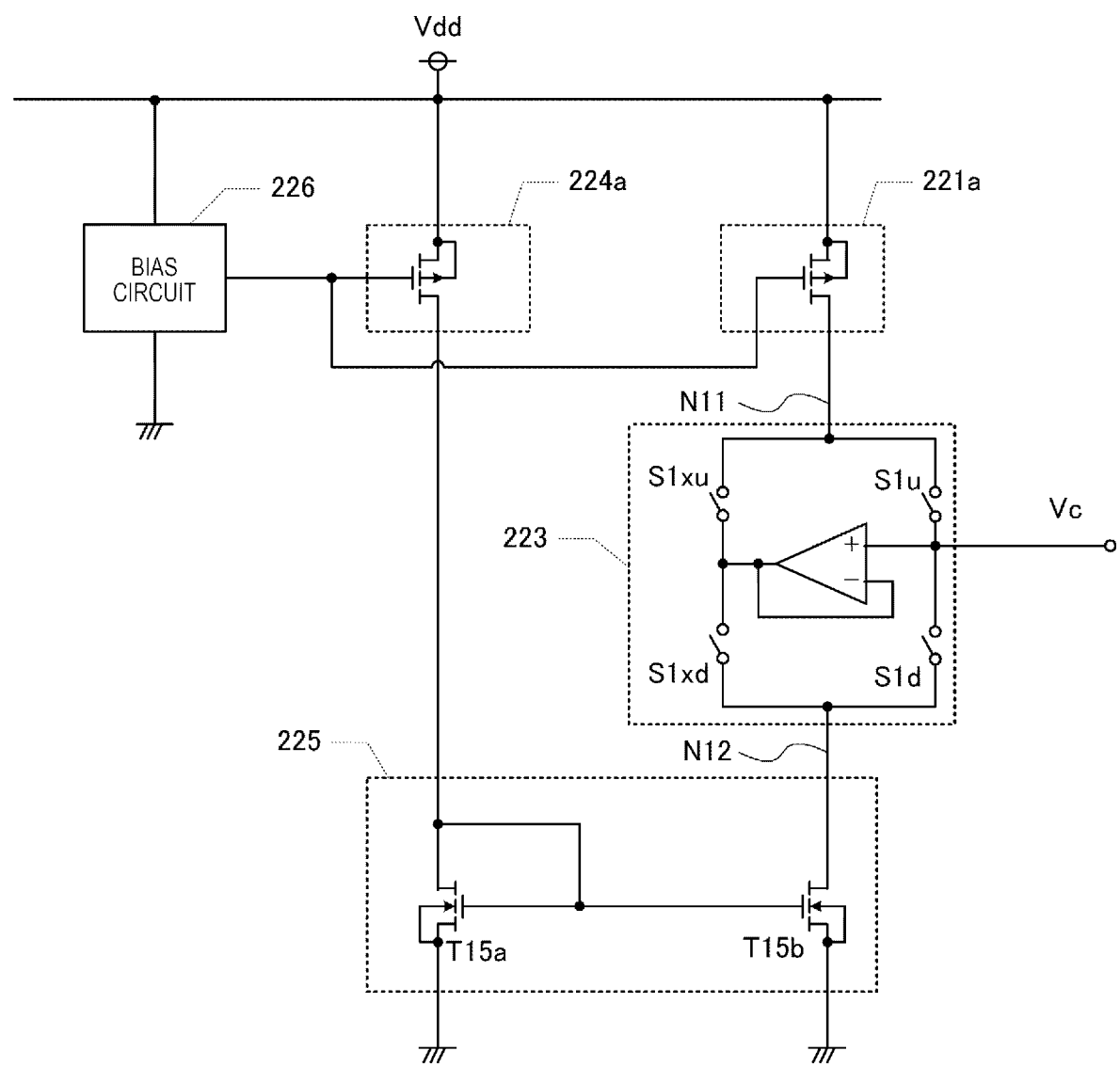
FIG. 6 is a diagram illustrating a configuration example of a charge pump having a current mirror circuit.

The current mirror-type circuit has a configuration as illustrated in FIG. 6, for example. In FIG. 6, the same components as those in FIG. 3 are represented by the same reference signs. In the configuration illustrated in FIG. 6, a first current source 221a includes a P-type enhancement mode MOS transistor. The first current source 221a is provided between the power supply node Vdd and the switch circuit 223, and a bias voltage generated by a bias circuit 226 is applied to the gate. Further, the source of the transistor is coupled to the power supply node Vdd, and the drain is coupled to the switch circuit 223 side.

A mirror current source 224a includes a P-type enhancement mode MOS transistor. The mirror current source 224a is provided between the power supply node Vdd and the current mirror current source 225, and the bias voltage generated by the bias circuit 226 is applied to the gate. Further, the source of the transistor is coupled to the power supply node Vdd, and the drain is coupled to the current mirror current source 225 side.

In the above circuit, the switch circuit 223 functions as the charge pump by switching the switch circuits S1u, S1xu, S1d, and S1xd to be turned on, off, off, and on in response to the UP signal from the phase frequency detector 21 and switching the switch circuit S1u, S1xu, S1d, and S1xd to be turned off, on, on, and off in response to the DOWN signal from the phase frequency detector 21.

In such a current mirror-type circuit, noise may be transmitted from the bias circuit 226 to the current source, and it is difficult to reduce the noise. However, in the charge pump 22 according to the present embodiment, since the first current source 221 (and the mirror current source 224) can be configured without using the bias circuit 226, current noise can be reduced.

(2) Second Embodiment

Figure 7:
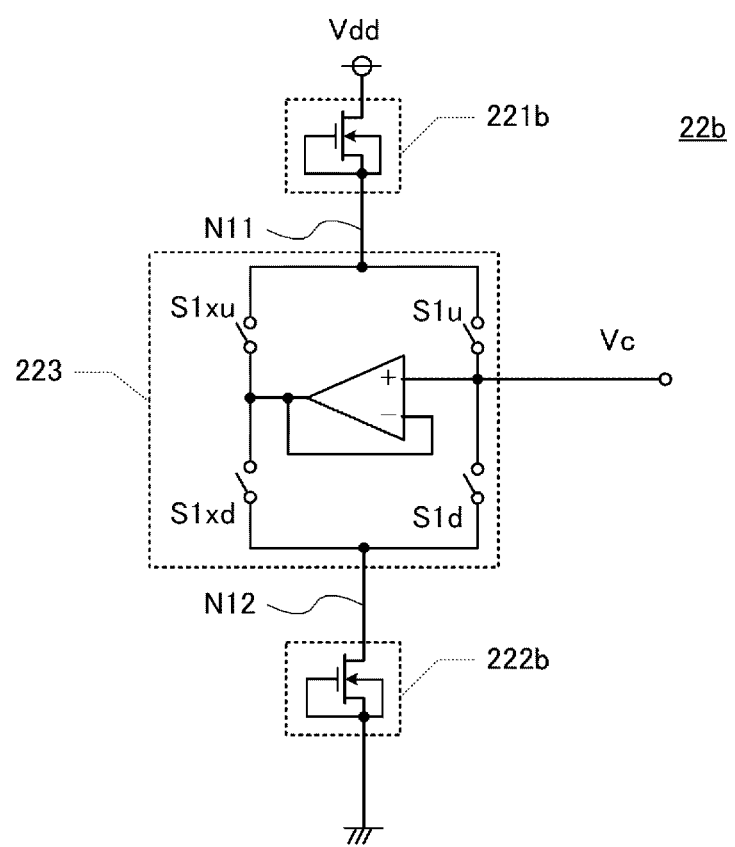
FIG. 7 is a diagram illustrating a charge pump according to a second embodiment.

FIG. 7 is a circuit diagram illustrating a charge pump 22b according to another embodiment of the present disclosure. The charge pump 22b includes a first current source 221b, a second current source 222b, and a switch circuit 223. The switch circuit 223 has the same configuration as that of the first embodiment. The first current source 221b includes one N-type depletion mode MOS transistor. The second current source 222b includes one N-type depletion mode MOS transistor. The transistors in the first current source 221b and the second current source 222b also form a self-bias circuit.

The transistor of the first current source 221b is provided between the power supply node Vdd and the switch circuit 223, and the drain of the transistor is coupled to the power supply node Vdd and the source is coupled to the current supply node N11.

The transistor of the second current source 222b is provided between the switch circuit 223 and the ground, and the drain of the transistor is coupled to the current drawing node N12 and the source is coupled to the ground. In the present embodiment, a bleeder current source is not coupled to the output node Vc, and the current source that draws the current from the output node Vc is the second current source 222b.

In the present embodiment, the switch circuit 223 turns on, off, off, and on the switch circuits S1u, S1xu, S1d, and S1xd in response to the UP signal from the phase frequency detector 21. As a result, the current is supplied from the first current source 221b to the output node Vc, the phase of the clock signal PLLCLK output from the voltage control oscillation circuit 24 is advanced based on the output voltage of the low pass filter 23, and the phase of the clock signal FBCLK is also advanced.

On the other hand, the switch circuit 223 turns off, on, on, and off the switch circuits S1u, S1xu, S1d, and S1xd in response to the DOWN signal from the phase frequency detector 21. As a result, the current is drawn from the output node Vc by the second current source 222b without supplying the current from the first current source 221b to the output node Vc. In this case, the phase of the clock signal PLLCLK output from the voltage control oscillation circuit 24 is delayed based on the output voltage of the low pass filter 23, and the phase of the clock signal FBCLK is also delayed.

With the above configuration, the charge pump 22b can output a current according to the output of the phase frequency detector 21. Further, both transistors of the first current source 221b and the second current source 222b are N-type, and can thus be manufactured in the same process, and common characteristics can be provided to both transistors. Therefore, the currents flowing through both transistors can easily match with each other, for example.

When the transistors of the first current source 221b and the second current source 222b are formed of different conduction-type transistors, it is assumed that an amount of element injected in the manufacturing process of each conduction-type channel can be adjusted so that characteristics of each transistor are made to common. However, the manufacturing process of each conduction-type channel is a different process and the element injected to form the channel is also different, and thus, it is actually difficult to have the characteristics of each conduction-type channel. However, in the present embodiment, the transistors of the first current source 221b and the second current source 222b are N-type having the same conduction-type, and thus, the characteristics of each transistor are made to common. Therefore, it is easy to adjust the current flowing to the first current source 221 and the second current source 222 to an expected value.

(3) Third Embodiment

Figure 8:
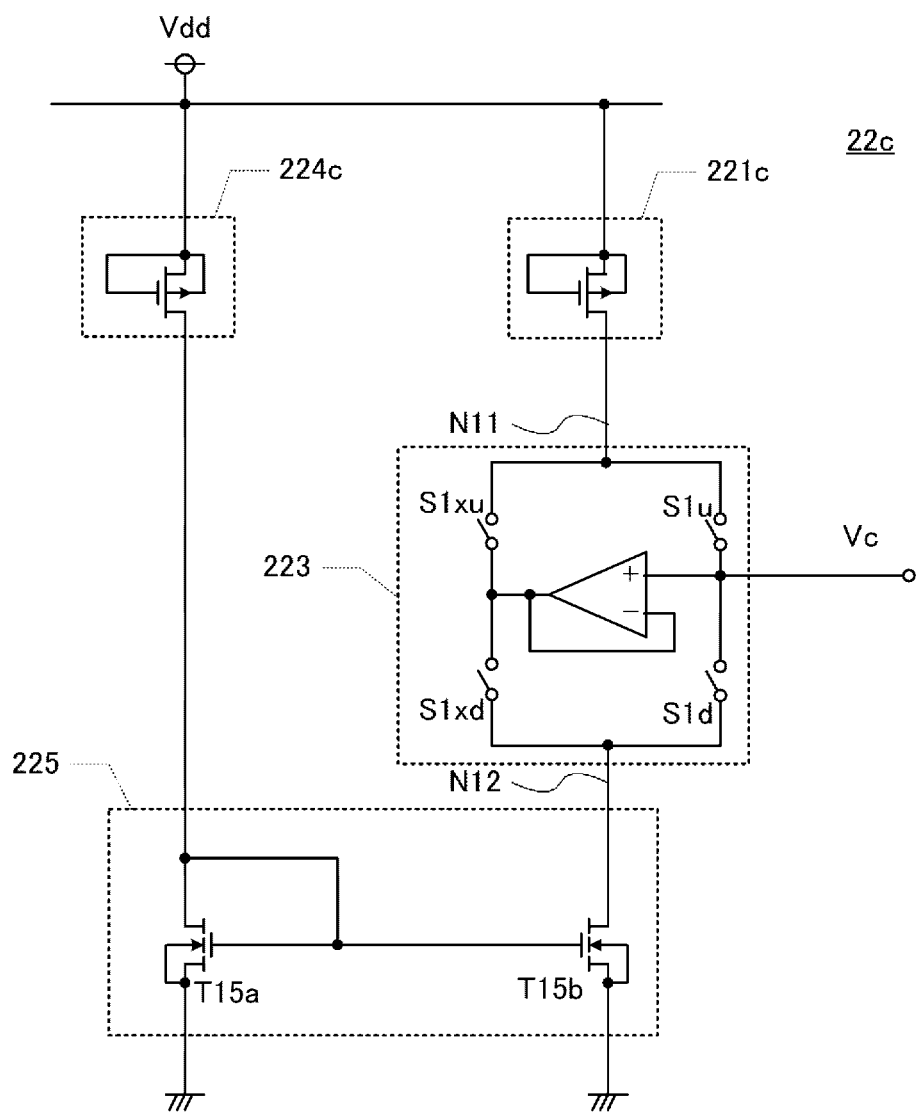
FIG. 8 is a diagram illustrating a charge pump according to a third embodiment.

FIG. 8 is a circuit diagram illustrating a charge pump 22c according to another embodiment of the present disclosure. The charge pump 22c includes a first current source 221c, a mirror current source 224c, a switch circuit 223, and a current mirror current source 225. In the present embodiment, the second current source is formed of the mirror current source 224c and the current mirror current source 225. The switch circuit 223 and the current mirror current source 225 have the same configurations as those of the first embodiment.

The first current source 221c includes one P-type depletion mode MOS transistor. The mirror current source 224c includes one P-type depletion mode MOS transistor. The transistors in the first current source 221c and the mirror current source 224c also form a self-bias circuit.

The transistor of the first current source 221c is provided between the power supply node Vdd and the switch circuit 223, and the source of the transistor is coupled to the power supply node Vdd and the drain is coupled to the current supply node N11. The transistor of the mirror current source 224c is provided between the power supply node Vdd and the current mirror current source 225, and the source of the transistor is coupled to the power supply node Vdd and the drain is coupled to the current mirror current source 225.

The current mirror current source 225 includes transistors T15a and T15b which are an N-type enhancement mode MOS transistors. The transistor T15a is provided between the mirror current source 224c and the ground, and the output of the mirror current source 224c is coupled to the drain and the ground is coupled to the source. The transistor T15b is provided between a current drawing node N12 and the ground, the current drawing node N12 is coupled to the drain, and the ground is coupled to the source. In the present embodiment, a bleeder current source is not coupled to the output node Vc, and the current source that draws the current from the output node Vc is the current mirror current source 225.

In the present embodiment, the switch circuit 223 turns on, off, off, and on the switch circuits S1u, S1xu, S1d, and S1xd in response to the UP signal from the phase frequency detector 21. As a result, the current is supplied from the first current source 221c to the output node Vc, the phase of the clock signal PLLCLK output from the voltage control oscillation circuit 24 is advanced based on the output voltage of the low pass filter 23, and the phase of the clock signal FCCLK is also advanced.

On the other hand, the switch circuit 223 turns off, on, on, and off the switch circuits S1u, S1xu, S1d, and S1xd in response to the DOWN signal from the phase frequency detector 21. As a result, the current is drawn from the output node Vc by the current mirror current source 225 without supplying the current from the first current source 221c to the output node Vc. In this case, the phase of the clock signal PLLCLK output from the voltage control oscillation circuit 24 is delayed based on the output voltage of the low pass filter 23, and the phase of the clock signal FCCLK is also delayed.

With the above configuration, the charge pump 22c can output a current according to the output of the phase frequency detector 21. Further, both transistors of the first current source 221c and the mirror current source 224c are P-type, and can thus be manufactured in the same process, and common characteristics can be provided to both transistors. Therefore, the currents flowing through both transistors can easily match with each other, for example.

When the transistors of the first current source 221c and the mirror current source 224c are formed of different conduction-type transistors, it is assumed that an amount of element injected in the manufacturing process of each conduction-type channel can be adjusted so that characteristics of each transistor are made to common. However, the manufacturing process of each conduction-type channel is a different process and the element injected to form the channel is also different, and thus, it is actually difficult to have the characteristics of each conduction-type channel.

In the present embodiment, the transistors of the first current source 221c and the mirror current source 224c are P-type having the same conduction-type, and thus, the characteristics of each transistor are made to common. The current flowing to the mirror current source 224c is mirrored by the transistor T15a forming the current mirror circuit, and the same current also flows through the transistor T15b.

Therefore, it is easy to adjust, for example, match the current supplied to the output node Vc by the first current source 221 with the current drawn from the output node Vc by the mirror current source 224c and the current mirror current source 225 as the second current source, to an expected value.

(4) Fourth Embodiment

Figure 9:
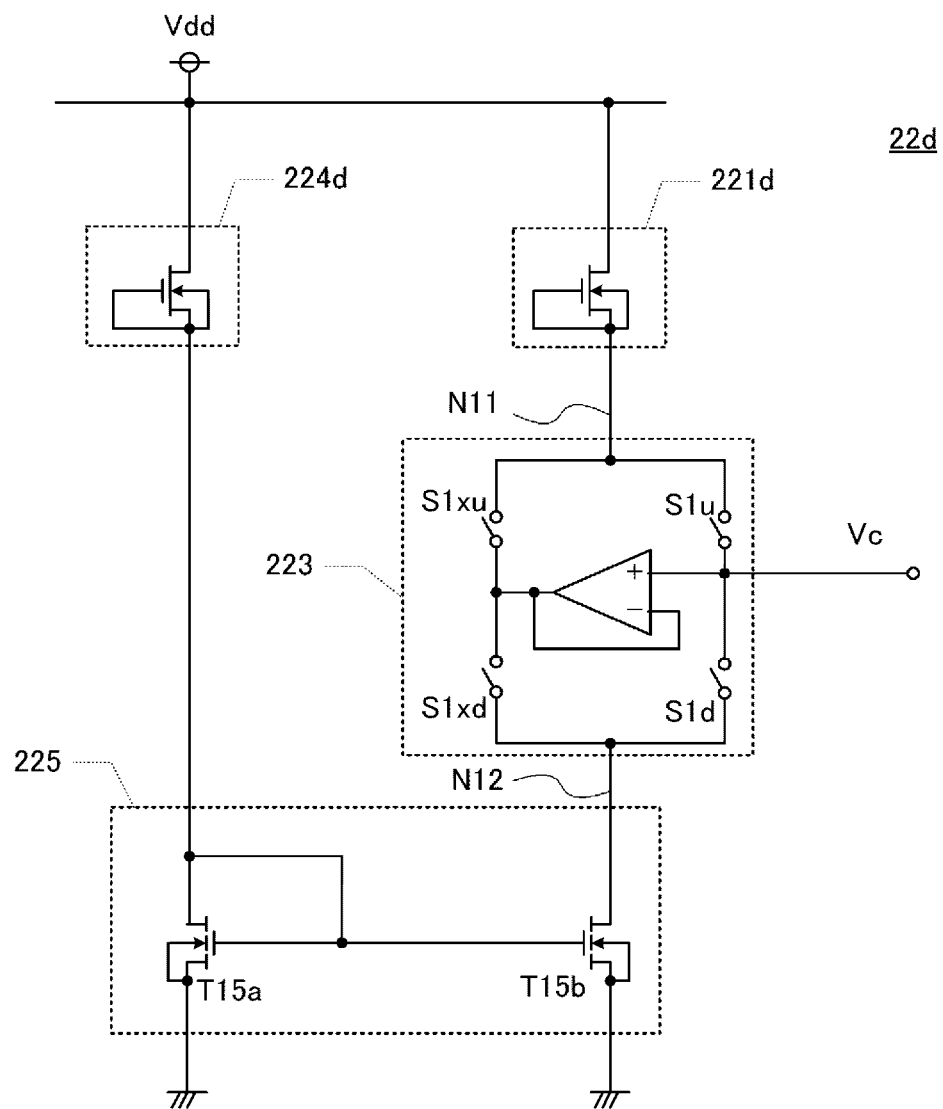
FIG. 9 is a diagram illustrating a charge pump according to a fourth embodiment.

FIG. 9 is a circuit diagram illustrating a charge pump 22d according to another embodiment of the present disclosure. The charge pump 22d includes a first current source 221d, a mirror current source 224d, a switch circuit 223, and a current mirror current source 225. In the present embodiment, the second current source is formed of a mirror current source 224d and the current mirror current source 225. The switch circuit 223 and the current mirror current source 225 have the same configurations as those of the first embodiment.

The first current source 221d includes one N-type depletion mode MOS transistor. The mirror current source 224d includes one N-type depletion mode MOS transistor. The transistors in the first current source 221d and the mirror current source 224d also form a self-bias circuit.

The transistor of the first current source 221d is provided between the power supply node Vdd and the switch circuit 223, and the drain of the transistor is coupled to the power supply node Vdd and the source is coupled to the current supply node N11. The transistor of the mirror current source 224d is provided between the power supply node Vdd and the current mirror current source 225, and the drain of the transistor is coupled to the power supply node Vdd and the source is coupled to the current mirror current source 225.

The current mirror current source 225 includes transistors T15a and T15b which are an N-type enhancement mode MOS transistors. The transistor T15a is provided between the mirror current source 224d and the ground, and the output of the mirror current source 224d is coupled to the drain and the ground is coupled to the source. The transistor T15b is provided between a current drawing node N12 and the ground, the current drawing node N12 is coupled to the drain, and the ground is coupled to the source. In the present embodiment, a bleeder current source is not coupled to the output node Vc, and the current source that draws the current from the output node Vc is the current mirror current source 225.

In the present embodiment, the switch circuit 223 turns on, off, off, and on the switch circuits S1u, S1xu, S1d, and S1xd in response to the UP signal from the phase frequency detector 21. As a result, the current is supplied from the first current source 221d to the output node Vc, the phase of the clock signal PLLCLK output from the voltage control oscillation circuit 24 is advanced based on the output voltage of the low pass filter 23, and the phase of the clock signal FBCLK is also advanced.

On the other hand, the switch circuit 223 turns off, on, on, and off the switch circuits S1u, S1xu, S1d, and S1xd in response to the DOWN signal from the phase frequency detector 21. As a result, the current is drawn from the output node Vc by the current mirror current source 225 without supplying the current from the first current source 221d to the output node Vc. In this case, the phase of the clock signal PLLCLK output from the voltage control oscillation circuit 24 is delayed based on the output voltage of the low pass filter 23, and the phase of the clock signal FBCLK is also delayed.

With the above configuration, the charge pump 22d can output a current according to the output of the phase frequency detector 21. Further, both transistors of the first current source 221d and the mirror current source 224d are N-type, and can thus be manufactured in the same process, and common characteristics can be provided to both transistors. Therefore, the currents flowing through both transistors can easily match with each other, for example.

When the transistors of the first current source 221d and the mirror current source 224d are formed of different conduction-type transistors, it is assumed that an amount of element injected in the manufacturing process of each conduction-type channel can be adjusted so that characteristics of each transistor are made to common. However, the manufacturing process of each conduction-type channel is a different process and the element injected to form the channel is also different, and thus, it is actually difficult to have the characteristics of each conduction-type channel.

However, in the present embodiment, the transistors of the first current source 221d and the mirror current source 224d are N-type having the same conduction-type, and thus, the characteristics of each transistor are made to common. The current flowing to the mirror current source 224d is mirrored by the transistor T15a forming the current mirror circuit, and the same current also flows through the transistor T15b. Therefore, it is easy to adjust, for example, match the current supplied to the output node Vc by the first current source 221 with the current drawn from the output node Vc by the mirror current source 224d and the current mirror current source 225 as the second current source, to an expected value.

The configuration illustrated in FIG. 9 is a configuration in which in the configuration illustrated in FIG. 8, the depletion mode MOS transistors of the first current source 221c and the mirror current source 224c are replaced with N-type from P-type. Since the N-type depletion mode MOS transistor is generally smaller in size than the P-type depletion mode MOS transistor, the configuration illustrated in FIG. 9 has a smaller circuit scale than the configuration illustrated in FIG. 8. Therefore, in another embodiment, the current source can be formed of either a P-type depletion mode MOS transistor or an N-type depletion mode MOS transistor, but in the latter case, the circuit scale can be made smaller than in the former case.

(5) Fifth Embodiment

Figure 10:
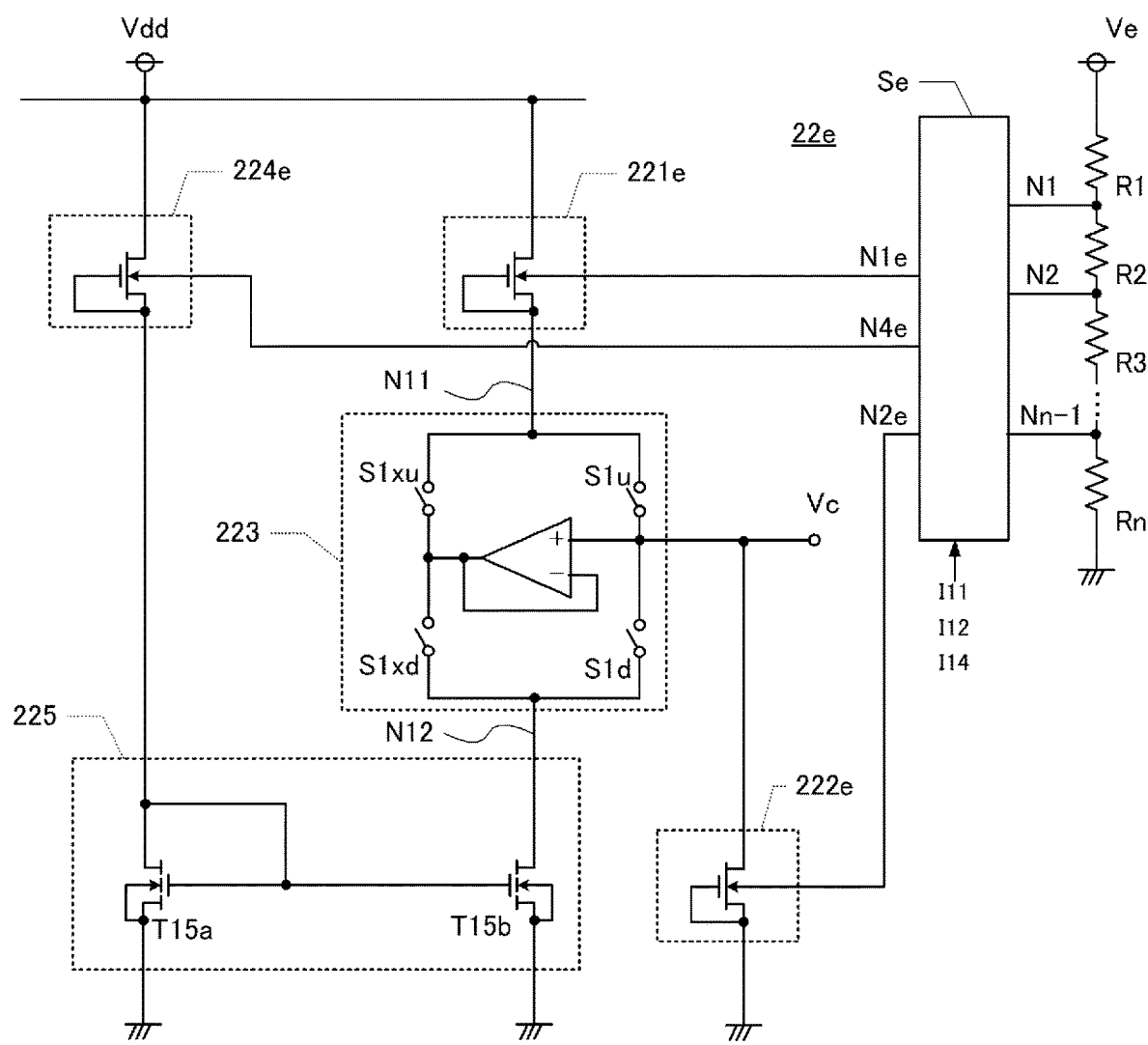
FIG. 10 is a diagram illustrating a charge pump according to a fifth embodiment.

FIG. 10 is a circuit diagram illustrating a charge pump 22e according to another embodiment of the present disclosure. The charge pump 22e includes a first current source 221e, a mirror current source 224e, a switch circuit 223, a current mirror current source 225, and a bleeder current source 222e. In the present embodiment, the second current source may be considered to be formed of the mirror current source 224e and the current mirror current source 225, may be considered to be formed of the bleeder current source 222e, or may be both of these current sources. The switch circuit 223 and the current mirror current source 225 have the same configurations as those of the first embodiment.

The first current source 221e includes one N-type depletion mode MOS transistor. The mirror current source 224e includes one N-type depletion mode MOS transistor. The bleeder current source 222e includes one N-type depletion mode MOS transistor. The transistors in the first current source 221e, the mirror current source 224e, and the bleeder current source 222e form a self-bias circuit.

The transistor of the first current source 221e is provided between the power supply node Vdd and the switch circuit 223, and the drain of the transistor is coupled to the power supply node Vdd and the source is coupled to the current supply node N11. The transistor of the mirror current source 224e is provided between the power supply node Vdd and the current mirror current source 225, and the drain of the transistor is coupled to the power supply node Vdd and the source is coupled to the current mirror current source 225. The transistor of the bleeder current source 222e is provided between the output node Vc and the ground, and the drain of the transistor is coupled to the output node Vc and the source is coupled to the ground.

The current mirror current source 225 includes transistors T15a and T15b which are an N-type enhancement mode MOS transistors. The transistor T15a is provided between the mirror current source 224e and the ground, and the output of the mirror current source 224e is coupled to the drain and the ground is coupled to the source. The transistor T15b is provided between a current drawing node N12 and the ground, the current drawing node N12 is coupled to the drain, and the ground is coupled to the source. In the present embodiment, since the bleeder current source is coupled to the output node Vc, the current can be drawn from the output node Vc by one or both of the current mirror current source 225 and the bleeder current source 222e.

In the present embodiment, the current flowing to the first current source 221e, the mirror current source 224e, and the bleeder current source 222e can be adjusted. That is, in the present embodiment, a plurality of voltage-dividing resistors R1, R2, and R3 to Rn (n is an integer indicating the number of resistance elements) are coupled in series between a power supply node Ve and the ground. Nodes N1 to Nn−1 for extracting an adjustment voltage are provided between the respective voltage-dividing resistors. The nodes N1 to Nn−1 are input to a selection circuit Se.

The selection circuit Se includes the first current source 221e, the mirror current source 224e, and nodes N1e, N4e, and N2e coupled to a back gate of the bleeder current source 222e. The selection circuit Se can select the adjustment voltage of any of the nodes N1 to Nn−1 to apply the selected adjustment voltage to any of the nodes N1e, N4e, and N2e. Specifically, the selection circuit Se according to the present embodiment receives the input of the values I11, I12, and I14 as in the above-described first embodiment, and the adjustment voltage applied to the nodes N1e, N4e, and N2e can be selected according to the values I11, I12, and I14. The selection circuit Se can be configured by various known circuits such as a switch circuit that selects a conductive node according to the values I11, I12, and I14.

In the MOS transistor, a threshold value changes when a potential difference is generated between a back gate terminal and a source terminal. Therefore, the adjustment voltage applied to the back gate is selected by the selection circuit Se, such that the magnitude of the current flowing to the first current source 221e, the mirror current source 224e, and the bleeder current source 222e can be selected. With the above configuration, adjustment, for example, making the magnitude of the current flowing to the first current source 221 greater than the sum of the current flowing to the mirror current source 224e and the bleeder current source 222e, can be easily implemented.

Furthermore, in the present embodiment, the switch circuit 223 turns on, off, off, and on the switch circuits S1u, S1xu, S1d, and S1xd in response to the UP signal from the phase frequency detector 21. As a result, the current is supplied from the first current source 221e to the output node Vc, and simultaneously, the bleeder current source 222e draws the current from the output node Vc. As a result, the phase of the clock signal PLLCLK output from the voltage control oscillation circuit 24 is advanced based on the output voltage of the low pass filter 23, and the phase of the clock signal FBCLK is also advanced.

On the other hand, the switch circuit 223 turns off, on, on, and off the switch circuits S1u, S1xu, S1d, and S1xd when the DOWN signal is output from the phase frequency detector 21. As a result, the current is drawn from the output node Vc by the current mirror current source 225 and the bleeder current source 222e without supplying the current from the first current source 221e to the output node Vc. In this case, the phase of the clock signal PLLCLK output from the voltage control oscillation circuit 24 is delayed based on the output voltage of the low pass filter 23, and the phase of the clock signal FBCLK is also delayed.

With the above configuration, the charge pump 22e can output a current according to the output of the phase frequency detector 21. Further, the transistors of the first current source 221e, the mirror current source 224e, and the bleeder current source 222e are N-type, and can thus be manufactured in the same process, and common characteristics can be provided to both transistors. Therefore, it can be considered that the same relationship between the magnitude of the current flowing to each of the first current source 221e, the mirror current source 224e, and the bleeder current source 222e and the voltage applied to the back gate is made.

Therefore, a desired relationship between the currents flowing to each of the first current source 221e, the mirror current source 224e, and the bleeder current source 222e can be made by selection of the selection circuit Se. For example, in a state where the switch circuits S1u, S1xu, S1d, and S1xd are turned on, off, off, and on, respectively, the adjustment, for example, making the current supplied by the first current source 221e greater than the current drawn by the bleeder current source 222e by a constant value, can be easily implemented. Further, adjustment, such as matching the current supplied by the first current source 221e with the current drawn by the current mirror current source 225, can be easily implemented.

(6) Other Embodiments

The above embodiment is an example for implementing the present disclosure, and various other embodiments can be adopted. For example, the PLL circuit may not be a fractional N-PLL circuit but may be a PLL circuit that does not include the delta-sigma modulation circuit 120, that is, a PLL circuit that multiplies the clock signal PLLCLK by an integer. The application target of the PLL circuit according to the embodiment of the present disclosure is not limited and can be used for various objects, for example, various electronic devices, electric components of vehicles, and the like.

In the above-described embodiment, the process for manufacturing the charge pump includes one step of forming the same conduction-type channel. When the step of forming the same conduction-type channel is performed twice or more, the same conduction-type depletion mode MOS transistor is preferably manufactured in the same process.

Furthermore, various changes may be made to the elements and circuits that make up the above-described embodiments. For example, the transistors T15a and T15b forming the current mirror current source 225 may be depletion mode. Further, the voltage follower circuit A11 may be omitted in the switch circuit 223 illustrated in FIG. 3 or the like. In FIGS. 7, 8, 9, and 10, the depletion mode MOS transistors forming respective current sources may be coupled in parallel, and the magnitude of the current may be selected by the switch circuit. It is a matter of course that the magnitude of the current may be selected by the voltage-dividing resistor.

Figure 11:
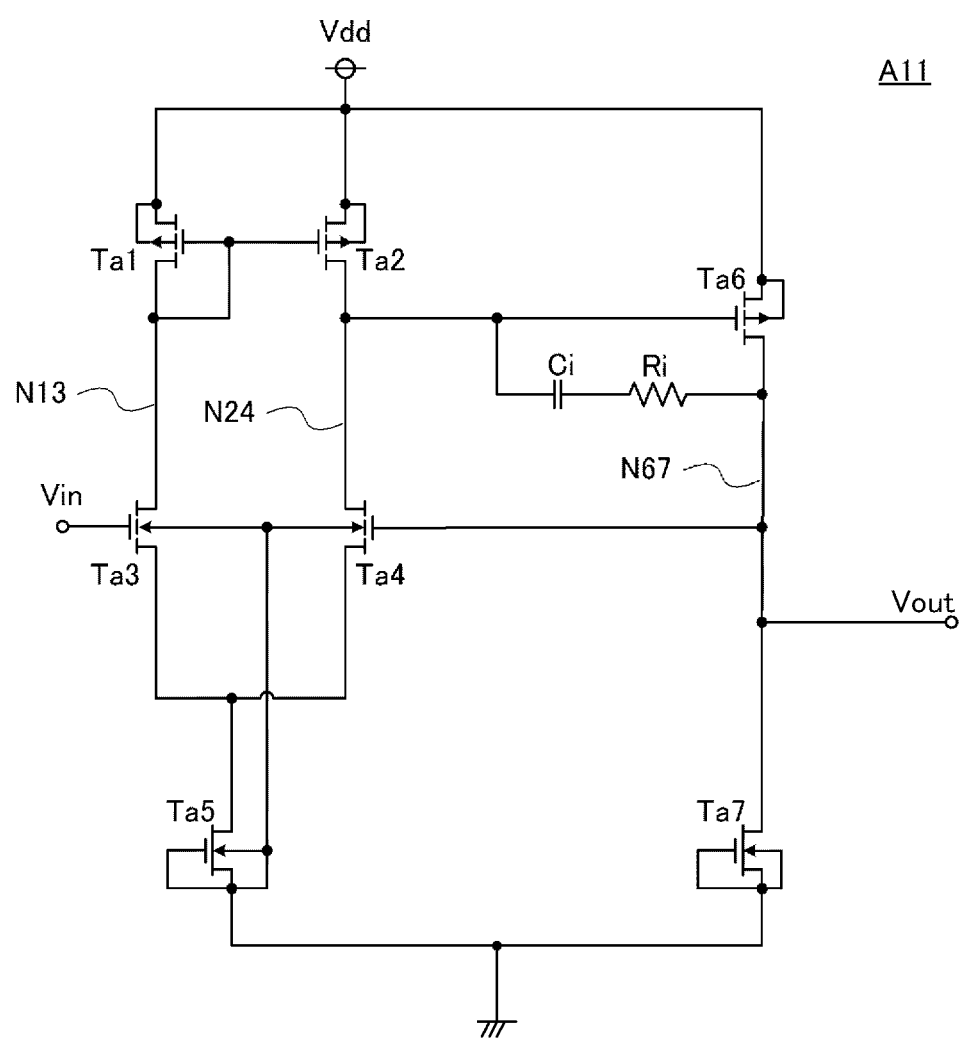
FIG. 11 is a diagram illustrating a configuration example of a voltage follower circuit.

Furthermore, the same conduction-type depletion mode MOS transistor as the current source may be used in the switch circuit constituting the charge pump. FIG. 11 is a diagram illustrating a configuration example of an operational amplifier included in the voltage follower circuit A11 included in the switch circuit 223. The voltage follower circuit A11 includes three transistors Ta1, Ta2, and Ta6 which are enhancement mode MOS transistors whose sources are coupled to the power supply node Vdd.

The drains of the transistors Ta1, Ta2, Ta6 are coupled to the nodes N13, N24, and N67. The node N67 is also the output node Vout of the voltage follower circuit A11. The drains of the transistors Ta3 and Ta4, which are N-type enhancement mode MOS transistors, are coupled to the nodes N13 and N24. The sources of the transistors Ta3 and Ta4 are coupled to the drain of the transistor Ta5 which is an N-type depletion mode MOS transistor. The source of the transistor Ta5 is coupled to the ground. The drain of a transistor Ta7, which is an N-type depletion mode MOS transistor, is coupled to the node N67. The source of the transistor Ta7 is coupled to the ground.

The gates of the transistors Ta1 and Ta2 are coupled to each other, and the gate of the transistor Ta1 is coupled to the node N13. The gate of the transistor Ta6 is coupled to the node N24, and the gate of the transistor Ta6 is coupled to the node N67 via a capacitor Ci and the resistance element Ri which are coupled in series.

The back gates of the transistors Ta3 and Ta4 are coupled to each other, and these gates are also coupled to the back gate of the transistor Ta5. Furthermore, the gates and sources of the transistors Ta5 and Ta7 are short-circuited to form a self-bias circuit. Accordingly, the transistors Ta5 and Ta7 are the same conduction-type depletion mode MOS transistors and function as a constant current source. Since the transistors Ta5 and Ta7 have the same conduction-type, adjustments such as making the magnitudes of the currents flowing through the transistors Ta5 and Ta7 same can be easily performed.

Figure 12:
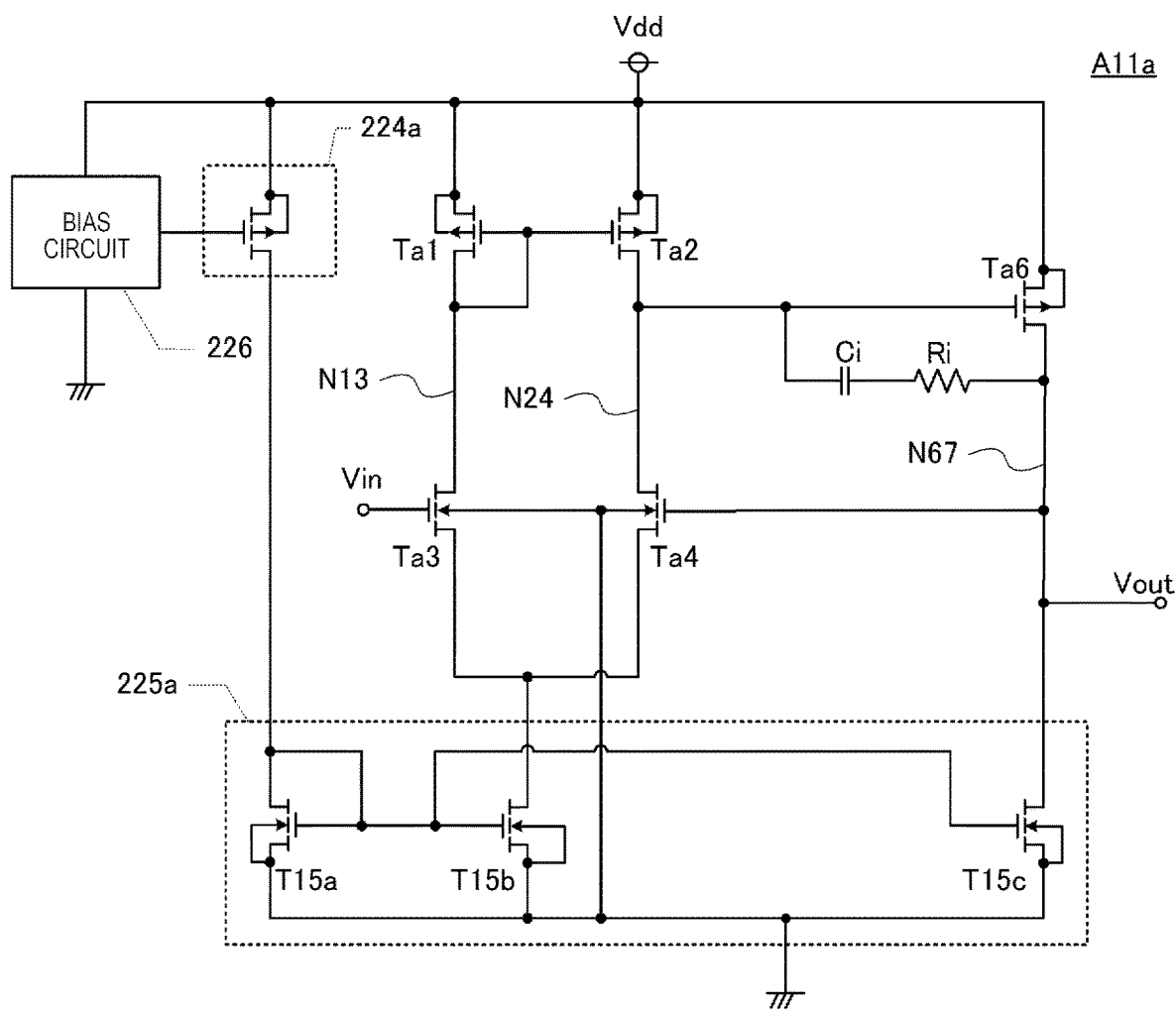
FIG. 12 is a diagram illustrating a configuration example of a voltage follower circuit having a current mirror circuit.

With the above configuration, the current mirror circuit included in many operational amplifiers can be omitted. FIG. 12 illustrates a configuration example of a voltage follower circuit A11a constituted by a general operational amplifier. In FIG. 12, the same components as those of the voltage follower circuit A11 in FIG. 11 are represented by the same reference signs. That is, wiring of the transistors Ta1, Ta2, Ta3, Ta4, and Ta6, the capacitor Ci, the resistance element Ri, and the nodes N13, N24, and N67, is the same as in FIG. 11. However, the voltage follower circuit A11a does not include the transistor Ta5, and therefore, the back gates of the transistors Ta3 and Ta4 are coupled to each other and further coupled to the ground.

In the voltage follower circuit A11a, the current source is formed of a current mirror circuit. The configuration of the current mirror circuit is similar to that illustrated in FIG. 6, and each component is represented by the same reference signs as those in FIG. 6. That is, the mirror current source 224a includes a P-type enhancement mode MOS transistor. The mirror current source 224a is provided between the power supply node Vdd and the current mirror current source 225a, and the bias voltage generated by the bias circuit 226 is applied to the gate. Further, the source of the transistor is coupled to the power supply node Vdd, and the drain is coupled to the current mirror current source 225 side.

The current mirror current source 225a includes transistors T15a, T15b, and T15c which are an N-type enhancement mode MOS transistors. The transistor T15a is provided between the mirror current source 224a and the ground, and the output of the mirror current source 224a is coupled to the drain and the ground is coupled to the source. The transistor T15b is provided between the transistors Ta3 and Ta4 and the ground, the sources of the transistors Ta3 and Ta4 are coupled to the drain of the transistor T15b, and the ground is coupled to the source of the transistor T15b.

The transistor T15c is provided between the output node Vout and the ground, the output node Vout is coupled to the drain of the transistor T15c, and the ground is coupled to the source of the transistor T15c. Furthermore, in the transistor T15a, the drain and the gate are coupled with each other, and the gates of the transistors T15a, T15b, and T15c are coupled with each other. As described above, the operational amplifier as the voltage follower circuit A11a can be configured to include the current mirror current source.

In the current mirror current source described above, power is consumed because the current always flows through portions other than the transistors T15b and T15c, for example, the bias circuit, the mirror current source 224a, and the transistor T15a. However, like the voltage follower circuit A11 illustrated in FIG. 11, if the bias circuit, the mirror current source 224a, and the transistor T15a are not provided, the current that is constantly flowing can be reduced, and therefore, the power consumption is reduced.

The switch circuit may switch the current source that is conducted to the output node based on the signal from the phase frequency detector including the PLL circuit. That is, in the charge pump, the current of the output node is controlled by switching between a state where the current is supplied to the output node by the first current source and a state where the current is drawn from the output node by the second current source. Since the current is controlled based on the signal from the phase frequency detector, the switch circuit may switch the current source involved in the current of the output node in response to the signal from the phase frequency detector.

The switch circuit may switch the state based on the signal from the phase frequency detector, the number of switches are optional as long as in this case. Further, as a configuration for switching the state in response to the signal, various configurations can be adopted, and for example, a transistor such as a MOS transistor or a bipolar transistor may be used, or other various switches may be used.

The signal from the phase frequency detector may show a comparison result of the phase frequency detector. Therefore, the signal from the phase frequency detector may be one or both of the UP signal indicating that the phase of the input signal to the phase frequency detector is advanced ahead of the phase of the feedback signal and the DOWN signal indicating that the phase of the input signal to the phase frequency detector is delayed behind the phase of the feedback signal. When one of the UP signal and the DOWN signal is input to the charge pump, in a period in which the signal is not input, an operation different from a period in which the signal is input is performed. For example, it is possible to adopt a configuration in which a current is supplied from the charge pump to the output node in a period in which the UP signal is being input, and the current is drawn from the output node by the charge pump in a period in which the UP signal is not being input. It is a matter of course that the bleeder current source that draws the current from the output node may be provided regardless of the state of the signal such as the UP signal, as in the above-described embodiment. Further, the signal from the phase frequency detector may be output via a circuit for noise cancellation (for example, a circuit that corrects a signal in a dead zone of the phase frequency detector).

The first current source is a current source provided between the high potential node and the switch circuit, and may supply the current to the output node by a first conduction-type depletion mode MOS transistor forming a self-bias circuit. That is, the first current source receives power from the high potential node and supplies the current to the output node. A value of the current in the first current source is a value determined by the depletion mode MOS transistor forming a self-bias circuit. The self-bias circuit may be configured so that the current flowing through the depletion mode MOS transistor becomes a constant current. Therefore, the voltage between the gate and the source may be set to a specific voltage (for example, 0). The high potential node is a node that has a higher potential than the low potential node, and is, for example, a positive power supply. The first current source may receive power from the high potential node and supply the current to the output node.

The conduction-type corresponds to the polarity (electrons or holes) of carriers flowing in the channel of the MOS transistor, and is N-type or P-type. The conduction-type of the first current source is a first conduction-type, and the conduction-type of the second current source is also the first conduction-type. That is, the conduction-types of the first current source and the second current source are the same. The first conduction-type may be N-type or P-type, but when the first conduction-type is N-type (when both the first current source and the second current source are N-type), the circuit scale can be reduced, which is preferable. That is, since the N-type depletion mode MOS transistor is generally smaller in size than the P-type depletion mode MOS transistor, if the depletion mode MOS transistors of the first current source and the second current source are N-type, the circuit scale is reduced as compared with a case where the depletion mode MOS transistors of the first current source and the second current source are P-type.

The second current source is a current source provided between the low potential node and the switch circuit, and may draw the current from the output node by a first conduction-type depletion mode MOS transistor forming a self-bias circuit. That is, the second current source may draw the current from the output node and pass the current to the low potential node. A value of the current in the second current source is a value determined by the depletion mode MOS transistor forming a self-bias circuit. Here, the self-bias circuit may be configured so that the current flowing through the depletion mode MOS transistor becomes a constant current. Therefore, the voltage between the gate and the source may be set to a specific voltage (for example, 0). The low potential node is a node that has a lower potential than the high potential node, and is, for example, a ground or a negative power supply.

What is claimed is:

1. A charge pump comprising:
 a switch circuit that switches a current source conducted to an output node based on a signal from a phase frequency detector included in a PLL circuit;
 a first current source provided between a high potential node and the switch circuit, wherein the first current source supplies a first current to the output node using first MOS transistors, coupled in parallel, forming first self-bias circuits; and a second current source provided between a low potential node and the switch circuit, wherein the second current source draws a second current from the output node using second MOS transistors, coupled in parallel, forming second self-bias circuits, wherein the first MOS transistors and the second MOS transistors are depletion type transistors having a same conductivity type, the first current source includes a first adjustment circuit that adjusts a magnitude of the first current, wherein the first adjustment circuit is configured as a first current source switch circuit including a first plurality of switches, and wherein each of the first plurality of switches is coupled in series to respective ones of the first MOS transistors, and the second current source includes a second adjustment circuit that adjusts a magnitude of the second current, wherein the second adjustment circuit is configured as a second current source switch circuit including a second plurality of switches, and wherein each of the second plurality of switches is coupled in series to respective ones of the second MOS transistors, wherein the switch circuit is connected between the first current source and the second current source, an output of the first current source is connected to a current supply node of the switch circuit, and an output of the second current source is connected to an input terminal of the switch circuit and to the output node.

2. The charge pump according to claim 1, wherein the second current source is at least one of a DOWN current source that draws the current from the output node when a DOWN signal is output from the phase frequency detector, and a bleeder current source that draws the current from the output node without depending on the output from the phase frequency detector.

3. The charge pump according to claim 1, wherein the switch circuit includes a voltage follower circuit, and the switch circuit switches between a state where the current supply node to which the current is supplied from the first current source and the output node are coupled to an input terminal of the voltage follower circuit, and a current drawing node from which the current is drawn by the current source is coupled to an output terminal of the voltage follower circuit, and a state where the current supply node is coupled to the output terminal and the output node and the current drawing node are coupled to the input terminal.

4. A PLL circuit comprising:

a phase frequency detector that compares a phase difference between an input signal and a feedback signal to output a pulse signal showing a comparison result;

the charge pump according to claim 1 that converts the pulse signal output by the phase frequency detector into a current;

a low pass filter that converts the current output by the charge pump into a smoothed voltage;

a voltage control oscillation circuit that outputs an output signal whose frequency changes according to a control voltage using an output voltage of the low pass filter as the control voltage; and a frequency division circuit that is provided on a signal path from an output of the voltage control oscillation circuit to an input of the phase frequency detector, and outputs the feedback signal.

5. An oscillator comprising the PLL circuit according to claim 4.

* * * * *